United States Patent [19]
Gilker et al.

[11] 4,090,225
[45] May 16, 1978

[54] FAIL-SAFE CIRCUIT FOR TAP-CHANGING TRANSFORMER REGULATING SYSTEM

[75] Inventors: Clyde Gilker, South Milwaukee; Arland D. Lamke, Franklin, both of Wis.

[73] Assignee: McGraw-Edison Company, Elgin, Ill.

[21] Appl. No.: 761,011

[22] Filed: Jan. 21, 1977

[51] Int. Cl.² .................. H02H 7/22; H02P 13/04
[52] U.S. Cl. ............................ 361/3; 323/43.5 R; 361/5
[58] Field of Search ................ 361/3, 5, 8, 2; 323/43.5 R, 43.5 S, 45

[56] References Cited

U.S. PATENT DOCUMENTS

| | | | |
|---|---|---|---|
| 3,436,646 | 4/1969 | Prescott | 323/43.5 R |
| 3,515,980 | 6/1970 | Throop | 323/43.5 S |
| 3,602,807 | 8/1971 | Prescott | 323/43.5 R |

Primary Examiner—Patrick R. Salce
Attorney, Agent, or Firm—Jon Carl Gealow; Ronald J. LaPorte; Thomas E. McDonald

[57] ABSTRACT

A tap-changing transformer system, utilized for voltage regulation of the line potential applied to a load from a source of energy, has a non-arcing switch to protect tap contacts during a tap change. A fail-safe circuit is utilized to determine that the non-arcing switch and its associated circuitry are operating properly before a movable tap contact is transferred from one stationary tap to another. In the event that the fail-safe circuit detects an improper operation of the non-arcing switch, the source is connected directly to the load to preclude the passage of any load current through the tap-changing transformer. A particular form of transfer switch useful in effecting the connection of the source directly to the load employs a current-limiting impedance arrangement.

12 Claims, 8 Drawing Figures

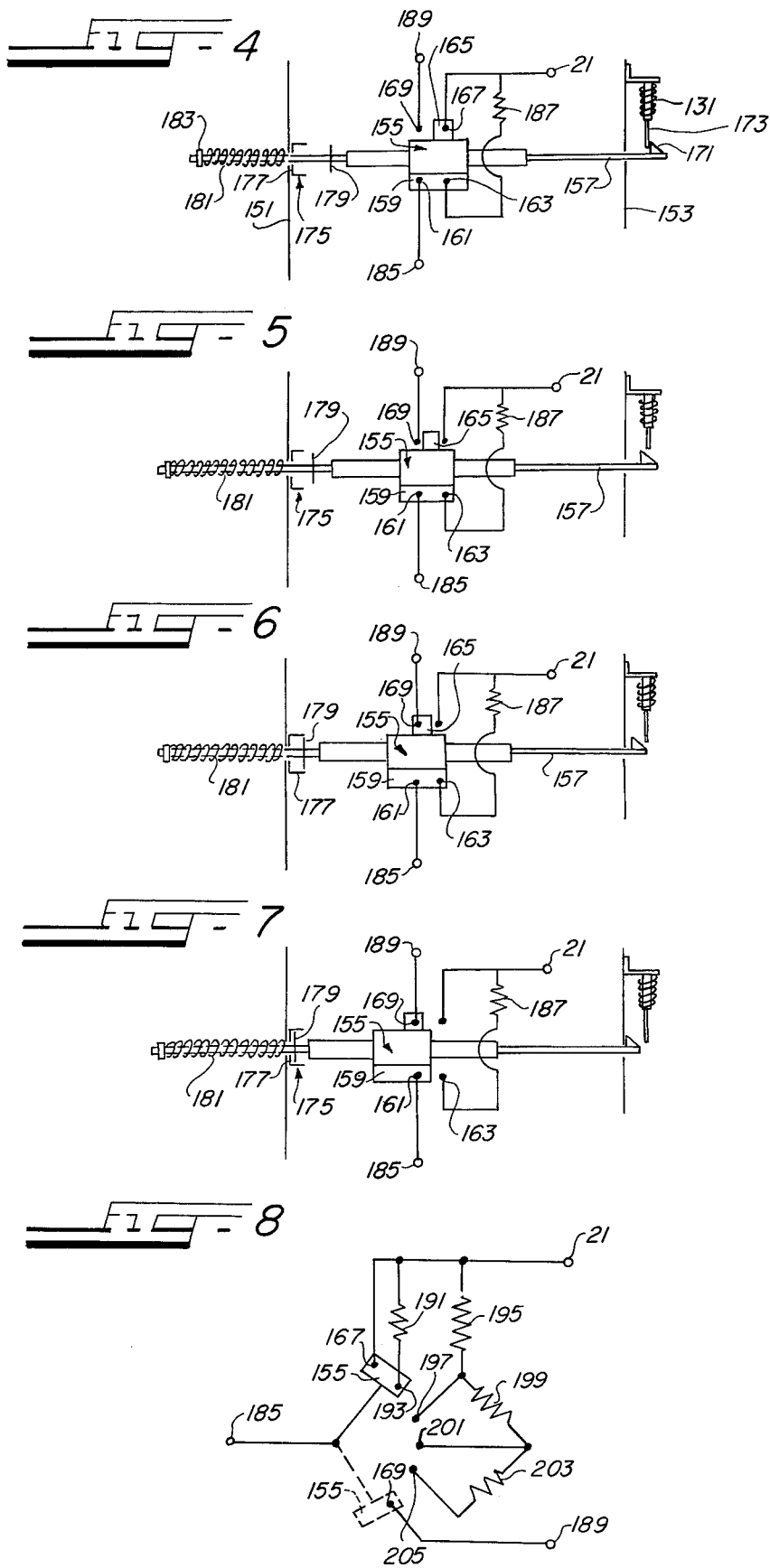

FAIL-SAFE CIRCUIT FOR TAP-CHANGING TRANSFORMER REGULATING SYSTEM

BACKGROUND OF THE INVENTION

1. Field of the Invention

This invention relates generally to voltage regulating systems employing tap-changing transformers, and more specifically, this invention relates to a fail-safe circuit for verifying that the non-arcing switch in the tap-changing transformer system is operating properly before a movable tap contact is moved to change the tap setting of the transformer.

2. Description of the Prior Art

In order to prevent the undesired, and sometimes destructive, effects of line voltage variations, various types of voltage regulators have been developed. One type of voltage regulator is the tap-changing transformer. This type of regulator is particularly useful in connection with the regulation of relatively high line voltages for the provision of relatively high power requirements.

A tap-changing transformer voltage regulating system employs a shunt winding, connected from the load line to the common side of the source, or directly across the source, and a series winding connected from the load line to the high or energy side of the source. The series winding is tapped or divided into a plurality of sections, with a stationary contact associated with each division between sections. A movable tap contact (or tap contacts) is automatically driven in response to a change in the line voltage. A reversing switch is automatically actuated in order to cause the flux produced by the series winding to be either additive or subtractive with respect to the flux of the shunt winding, hence increasing or decreasing the line voltage as required.

Inasmuch as the load current is passing through the series winding, a tap change can result in the formation of relatively large electrical arcs. Such arcs are destructive to the movable tap contacts and the stationary contacts, thus reducing the life of the tap switch. In addition, since the tap-changing transformer is located in an oil bath, the action of the arc on the oil causes reduction of the oil to produce carbon in a solid or particulate form and hydrogen in gaseous form.

In order to minimize undesirable arcs at the tap switch, a pair of tap contacts are individually connected to the source through a line having a bridging reactor (or preventive autotransformer). A non-arcing switch is connected between the parallel tap contact lines, and each of the lines includes a current redirecting switch on the source side of the non-arcing switch. When it is desired to move a tap contact, a control motor is energized to open the current redirecting switch in that line to cause the current flow for that tap contact to pass through the normally closed non-arcing switch. The non-arcing switch is then opened to break the current flow to that tap contact, after which the control motor transfers the tap contact. The non-arcing switch is then closed, after which the current redirecting switch for the tap contact that was moved is closed.

While this arrangement works quite well, failure or improper operation of the non-arcing switch, or failure of a current redirecting switch to open, will result in production of undesired arcs at the tap-changing transformer contacts. Such failures, and the resultant undesired arcs, could go undetected for quite some time, thus resulting in considerable contact damage and the reduction of oil. Accordingly, it is desirable to remove the tap-changing transformer regulating system from the load circuit and/or indicate an improper operation of the current redirecting or non-arcing switches.

In general, the prior art reveals little in the way of concrete efforts to overcome the problems of a failure in the current redirecting and non-arcing switches. An example of one approach that has been tried is illustrated in U.S. Pat. No. 3,436,646—Prescott. This arrangement utilizes a number of switches to test for circuit conditions after each desired opening or closing of a current redirecting switch or the non-arcing switch. Hence, as shown in FIG. 2 of the patent, a sequential checking of the current redirecting and transfer switches appears to be achieved. While this reference at least shows an attempt to deal with the problem of a failure in a current redirecting and non-arcing switches, it involves a rather complex arrangement that provides more information than is actually required, so long as the protecting system is operating. Accordingly, the prior art does not disclose any simple, reliable arrangement for determining that a tap-change can be effected without fear of an undesirable arcing condition.

SUMMARY OF THE INVENTION

The present invention obviates the deficiencies of the prior art by providing a fail-safe circuit that tests circuit conditions immediately prior to transfer of a movable tap contact during a tap change and determines whether such a tap change can be effected without arcing at the tap contacts. This desirable protection is achieved by utilizing a test immediately prior to the transfer of the movable tap contact in order to verify that proper current redirecting switch and non-arcing switch operation was achieved. If an improper switch condition is detected, the tap-changing transformer is removed from the load circuit and/or an indication of the defective switch operation is produced.

In the fail-safe circuit of this invention, an input is obtained that corresponds to the energizing voltage applied to an energizable device, such as a motor, that drives the movable tap contact. (This motor can also be utilized, as in the preferred embodiment disclosed herein, to control the current redirecting switches and the non-arcing switch.) An input signal for the circuit is derived from this voltage by utilization of a first rectifier circuit which provides a DC input signal. This DC input signal is connected across a first gating device, such as a silicon controlled rectifier (SCR). So long as the first gating device remains unactuated, the input signal appears across the first gating device, which appears as an open circuit.

A current transformer is located in series with the non-arcing switch to monitor the current flow through the non-arcing switch. The output of the current transformer is applied across a second rectifying circuit to produce a DC reference signal indicative of the current flow through the non-arcing switch. This reference or triggering voltage is applied to the gate terminal of the first gating device or SCR to trigger the first gating device into a conducting state when current flow is detected through the non-arcing switch. The magnitude of the reference signal applied to the gate of the first SCR is limited by a Zener diode.

Both the reference or triggering voltage and the input voltage appearing across the first gating device are applied to one side of a fail-safe control switch that is the opposite of the non-arcing switch (i.e., the fail-safe control switch is open when the non-arcing switch is closed and closed when the non-arcing switch is open). As the non-arcing switch is opened immediately prior to transfer of the movable tap contact, this means that the fail-safe control switch can be utilized to test circuit conditions immediately prior to such a tap contact transfer. The other side of the fail-safe control switch is connected to apply a triggering voltage to a second or output gating device, such as a silicon controlled rectifier (SCR), if an improper circuit condition is detected. This output SCR produces an output signal if the tap contact position should not be changed because of a circuit abnormality. It should be noted that it is necessary to prevent the input signal from triggering the first SCR through the path leading to the first side of the fail-safe control switch, and thus a unidirectional conducting device, such as a diode, is located in that lead.

If current flows through the non-arcing switch, as it should immediately prior to a tap contact transfer if the selected current redirecting switch has been properly opened and the non-arcing switch is functioning properly, the first SCR is triggered into conduction to bypass the input signal and prevent it from being applied to the fail-safe control switch. However, if no such current flow exists, the input signal is applied to the gate terminal of the second SCR to produce an output signal. Also, upon opening of the non-arcing switch to prevent current flow to the tap contact being moved, current flow through the non-arcing switch should rapidly decrease and the reference signal disappear in a relatively short time (such as the time until the next current zero, if a non-arcing switch held open by current flow therethrough is utilized). Accordingly, a timing circuit including an RC network and a breakdown device are connected to the gate of the second SCR, so that if the reference signal does not disappear within the predetermined time an output signal will be produced by the second SCR.

Upon receipt of an output signal from the second SCR, indicating an improper circuit performance, the tap-changing transformer system is circumvented or removed from the load line by connecting the source directly to the load. This is achieved by an appropriate transfer switching arrangement. This transfer switch may be in the form of a contact block, mounted for actuation upon production of an output signal, to connect the source directly to the load. It may be desired to have an impedance network, such as a plurality of resistors, sequentially inserted into the circuit between the source and the tap-changing transformer to reduce the effects of circulating currents produced when the source connections are being transferred.

If the tap-changing transformer is energized under no-load conditions, the lack of current flow through the non-arcing switch will result in the fail-safe circuit circumventing the tap-changing transformer. Accordingly, a second current transformer is located in the load line to detect load current. In the absence of load current, a switch is actuated to prevent the production of an input signal. Thus, the fail-safe circuit will not produce an output signal to actuate the transfer switch to connect the source directly to the load.

Another desirable feature is to utilize some form of indicating arrangement to let an operator know that an improper circuit condition has been detected in the tap-changing transformer system. One way to achieve this indication is to have the output signal of the fail-safe circuit also actuate a switch to cause the fuse in the motor circuit to blow, thus providing an indication of improper operation as well as precluding actuation of the motor until the defective switch operation has been remedied. Another possibility would be to have an appropriate indicator, such as a lamp, triggered by the output signal. Of course, there may also be situations in which it would be desired to have the tap-changing regulator continue operation, even at the risk of contact damage and breakdown of the oil. In such a case, the output signals of the fail-safe circuit could be utilized just to trigger an appropriate indicator to alert an operator to the necessity of taking some corrective action.

When the fail-safe circuit disclosed in this application, a potentially damaging tap change is precluded by determining that circuit conditions immediately prior to the tap contact transfer are improper. The fail-safe circuit is relatively noncomplex and reliable, while utilizing solid state switching to minimize the possiblility of improper fail-safe circuit outputs.

These and other objects, advantages and features of this invention will hereinafter appear, and for purposes of illustration, but not of limitation, an exemplary embodiment of the subject invention is shown in the appended drawing.

BRIEF DESCRIPTION OF THE DRAWING

FIG. 4 is a schematic diagram of a preferred embodiment of a transfer switch for utilization in connection with the present invention.

FIG. 5 is a schematic diagram corresponding to FIG. 4 illustrating a different set of conditions.

FIG. 6 is a schematic diagram corresponding to FIG. 4 showing yet another set of conditions.

FIG. 7 is a schematic diagram corresponding to FIG. 4 showing still another set of conditions.

FIG. 8 is a schematic circuit diagram illustrating a modification of the preferred embodiment of FIG. 4.

DETAILED DESCRIPTION OF THE PREFERRED EMBODIMENT

Figure 1:
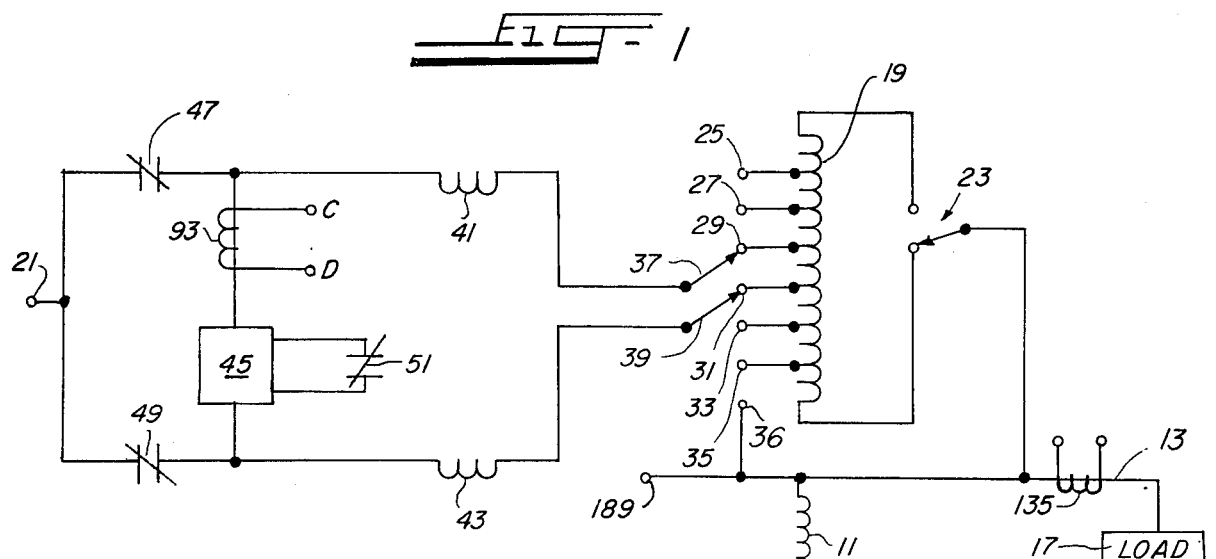
FIG. 1 is a schematic circuit diagram of a tap-changing transformer voltage regulating system with which the present invention may be employed.

A tap-changing transformer voltage regulating system, of the tupe with which the fail-safe circuit of this invention is utilized, is depicted in FIG. 1. A shunt winding 11 is connected between a load line 13 and a common line 15 of the source of power (although shunt winding 11 could be connected directly across the source). The shunt winding 11 is in parallel with whatever system or systems is fed from the load line 13, such system or systems being schematically indicated as a load 17.

A series winding 19 is connected to the high or energy side of the source that is applied to terminal 21. The flux produced by series winding 19 either supports or opposes the flux of the shunt winding 11, a reversing switch 23 determining whether the flux of series winding 19 is going to be additive or subtractive with respect to the flux of shunt winding 11.

Series winding 19 is tapped or divided into a series of sections permitting changes in the flux produced by the series winding 19 to be made in incremental steps (to add to or subtract from the flux of the shunt winding to keep the flux in the shunt winding 11, and hence the load voltage, constant). These steps are indicated by a series of stationary taps or contacts 25, 27, 29, 31, 33, 35 and 36. This last stationary contact 36 is a "zero" position and is utilized during movement of switch 23. A pair of movable tap contacts 37 and 39 engage appropriate stationary contacts to provide for the flow of load current from terminal 21 to load 17, while providing the appropriate adjustment of the load voltage. This current flow occurs through an appropriate bridging reactor consisting, for example, of coils 41 and 43 wound on a common core.

In order to preclude undesired arcing as a movable tap contact 37 or 39 is transferred from one stationary contact to another, the non-arcing switch 45 is utilized. Non-arcing switch 45 may be any appropriate switch of this type, although in the preferred embodiment disclosed herein a non-arcing switch utilizing solid state devices, such as a pair of SCR's, is employed. The non-arcing switch 45 is utilized in conjunction with a pair of current redirecting switches 47 and 49. Operation of the non-arcing switch 45 is appropriately controlled, such as by the schematically illustrated control switch 51, which may be utilized to gate the solid state devices of the non-arcing switch 45 utilized in this preferred embodiment.

To illustrate operation of the tap-changing transformer voltage regulator, assume that the reversing switch 23 is in a position to lower the output voltage (i.e., the flux of series winding 19 opposes or subtracts from the flux of shunt winding 11). If it is desired to increase the line voltage, this would mean that the total opposing flux of series winding 19 should be reduced, such as by moving the tap contact 37 from stationary contact 29 to stationary contact 31.

With this assumed illustrative example, current redirecting switch 47 would be opened, so that the portion of the load current passing through the switch 47 would be redirected through the normally closed non-arcing switch 45. Then, the control switch 51 would be opened to remove the gating signal from the SCR's of non-arcing switch 45 to cause non-arcing switch 45 to open at the next current zero, thus causing all of the load current to pass through the tap contact 39. At this point, the movable tap contact 37 may be moved to stationary contact 31 without any arcing. Control switch 51 would then be closed to gate the SCR's of non-arcing switch 45 and cause non-arcing switch 45 to return to the closed condition, at which time current would again flow through the non-arcing switch 45 and the movable tap contact 37. Current redirecting switch 47 would then be closed to complete the tap change.

Figure 2:
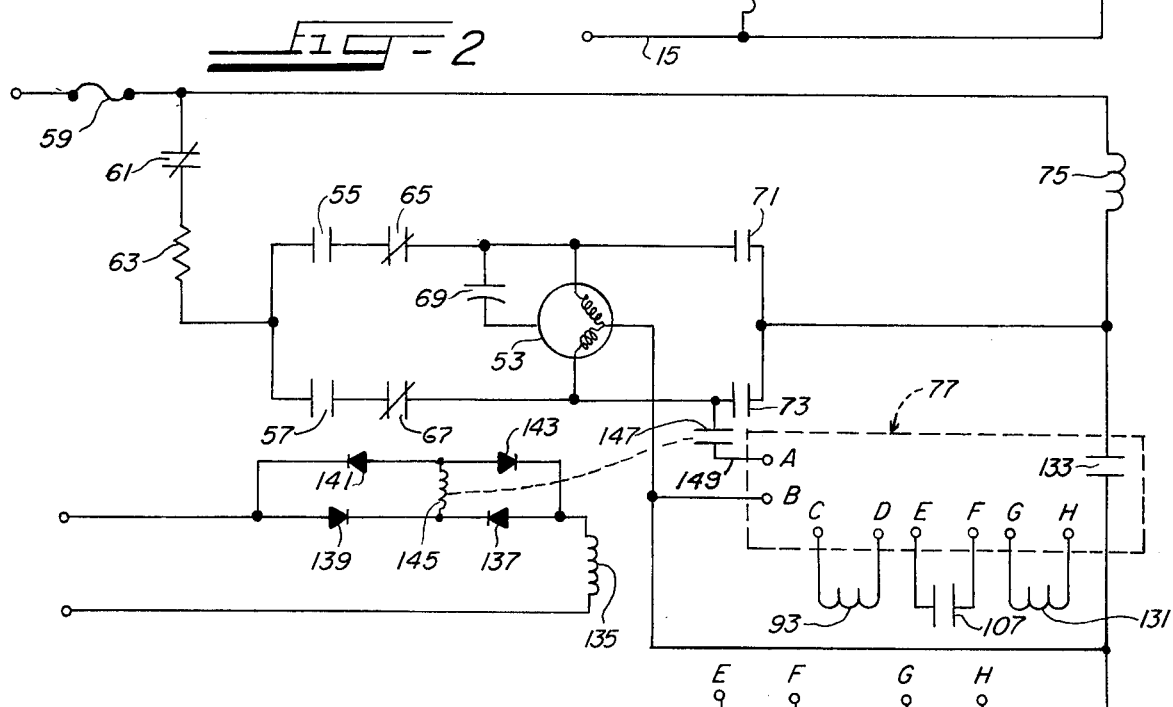
FIG. 2 is a schematic circuit diagram of a tap-changing control system generally illustrating connections to the fail-safe circuit of the present invention.

A system for mechanically effecting the movement of the tap contacts 37 and 39 is illustrated in FIG. 2. An energizable device, such as a motor 53, is utilized to drive the movable tap contacts 37 and 39, as well as the redirecting switches 47 and 49 and the control switch 51. When a tap-changing action is called for, one of the control switches 55 or 57 will be closed, depending upon the direction in which the movable tap contact is to be moved. These contacts 55 and 57 are actuated by appropraite time delay relays. Upon closure of one of the control switches 55 or 57, the motor will be energized through a fuse 59, normally closed contact 61, resistor 63, the appropriate control switch 55 or 57, and a corresponding normally closed limit switch 65 or 67.

In the case of the control switch 55, the circuit would also include a capacitor 69. Normally closed limit switches 65 and 67 would be opened upon the movable tap contacts 37 and 39 reaching the last stationary contact 25-35 in the direction of motion indicated by the corresponding control switch 55 or 57.

As the motor 53 begins its rotation, it will close one of the holding switches 71 or 73, corresponding to the direction of motion of the motor. Closure of the appropriate switch 71 or 73 results in energization of the relay coil 75, which opens the normally closed switch 61, thus precluding operation changes while a tap change is in progress. After completion of the desired tap change, the closed holding switch 71 or 73 will open to de-energize coil 75 and cause switch 61 to return to its normally closed state to permit initiation of another tap change.

Figure 3:
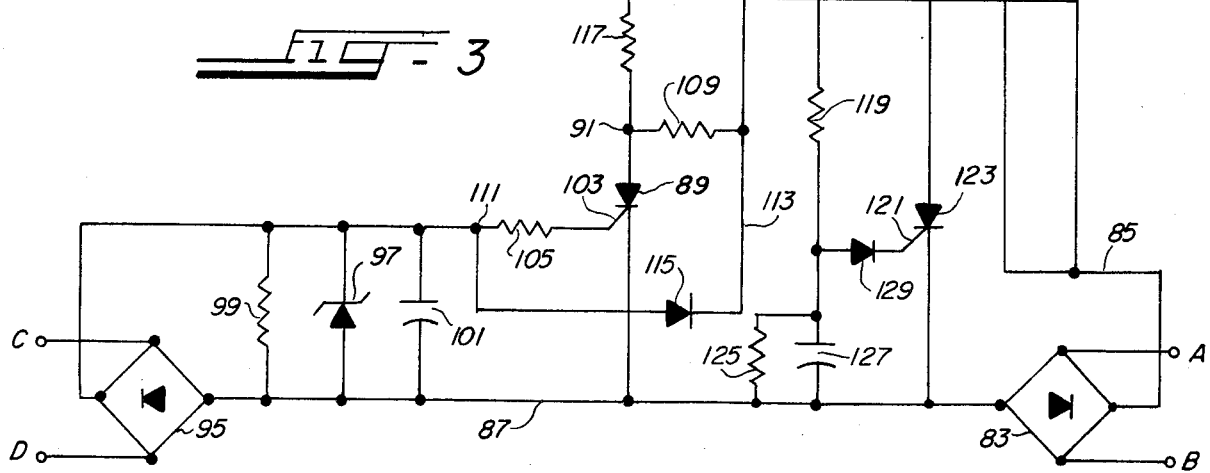
FIG. 3 is a schematic circuit diagram of a preferred embodiment of the fail-safe circuit of the present invention.

A fail-safe circuit according to the present invention is schematically illustrated at 77. This fail-safe circuit 77 is shown in greater detail in FIG. 3.

As may be seen in FIG. 2, the voltage applied to motor 53 is also applied across terminals A and B of fail-safe circuit 77. Terminal B is connected to the common line of the motor circuit, while terminal A is connected to one side of the motor (autotransformer action will provide a voltage at this point regardless of the direction of motor energization). The motor voltage across terminals A and B is applied to a rectifier circuit 83, as may be seen in FIG. 3, which produces a DC input signal on line 85. The DC input signal on line 85 is referred to common line 87 of the fail-safe circuit and is applied across a first gating device or SCR 89. In its non-conducting state, SCR 89 appears as an open circuit, so that the DC input signal appears entirely across SCR 89 from the point 91 to the common line 87.

A current transformer 93 is located in the non-arcing switch line, in order to monitor and detect any current flow through the non-arcing switch 45. Current transformer 93 provides a reference signal indicative of the current flow conditions in non-arcing switch 45 at terminals C and D. The reference signal produced by current transformer 93 as a result of monitoring current conditions in the non-arcing switch 45 is applied to a second rectifier circuit 95 to produce DC reference or triggering voltage for SCR 89. The magnitude of this triggering signal is limited by a Zener diode 97, which is connected in parallel with a resistor 99 and a capacitor 101. The triggering voltage established by current transformer 93, rectifier current 95 and Zener diode 97 is applied to the gate terminal or electrode 103 of SCR 89 through a resistor 105.

A switch 107 is utilized to track the opposite of the non-arcing switch 45 (i.e., switch 107 is open when non-arcing switch 45 is closed and vice versa). Since the control switch 51 directly controls and exhibits the same states as non-arcing switch 45 (i.e., switch 51 is closed when non-arcing switch 45 is closed and open when non-arcing switch 45 is open), the switch 107 also reflects the opposite conditions from control switch 51, and it is this relationship that is utilized in this preferred embodiment, although any appropriate control arrangement may be utilized to have switch 107 yield the opposite condition from non-arcing switch 45. Switch 107 is connected between terminals E and F in the fail-safe circuit 77.

The input signal appearing across SCR 89 at point 91 is connected to terminal E through a resistor 109. Similarly, the reference or triggering voltage across Zener diode 97, appearing at point 111, is connected to terminal E through a line 113. In order to prevent the input signal at point 91 from being fed back through line 113 to trigger SCR 89, a unidirectional conducting device or diode 115 is located in line 113.

When control switch 51 is opened to open non-arcing switch 45, switch 107 is closed at this time. If current flowed through non-arcing switch 45 prior to the opening of control switch 51, which it should have, the triggering voltage at point 111 would have placed SCR 89 in a conducting state, essentially shorting point 91 to the common line 87. In such a state, the entire input signal between line 85 and common line 87 would appear across a resistor 117 located in line 85, so that no voltage would be connected to terminal E from point 91. However, if there had been no current flow through the non-arcing switch 51, such as by a failure of the proper current redirecting switch to open or a failure of the non-arcing switch 45, SCR 89 would not have been gated on, so that the input voltage at point 91 would be conveyed to terminal E. This input voltage would then be conveyed through switch 107 and a resistor 119 to the gate terminal of electrode 121 of an SCR 123. Accordingly, SCR 123 would be triggered into a conducting state to produce an output signal across terminals G and H. This output signal would be provided by the input voltage appearing from line 85 to common line 87. Therefore, an output signal is produced to indicate that current flow did not exist through the non-arcing switch when it should have, which could mean that load current is still flowing through the tap contact to be moved, and thus presents the possibility of an undesired arc.

Upon opening of the control switch 51, the non-arcing switch 45 should open to terminate current flow to the tap contact 37 and 39 that is to be moved, assuming that the current flow has been properly redirected through the non-arcing switch 45. If for some reason this current flow does not terminate rather quickly (i.e., within one-half cycle, the maximum time required to reach the next current zero), the possibility of undesired arcing during moving of the tap contact still exists. Therefore, it is also necessary to produce an output from the fail-safe circuit 77 upon the occurrence of this eventuality.

To achieve this function, the reference or triggering voltage at point 111 is conveyed to the terminal E and thence through switch 107 and to a timing circuit of resistor 119 and a capacitor 127. In addition, the timing circuit incorporates a breakdown device 129. Thus, if the voltage appearing at point 111 is still great enough after a time determined by resistor 119 and capacitor 127 to cause breakdown of device 129, SCR 123 will be triggered to provide an output signal across terminals G and H. (A resistor 125 is included to provide a bleed path for capacitor 127, but as this resistor 125 is very large in comparison to resistor 119, it has very little effect on the changing time of capacitor 127.)

The output signal appearing at terminals G and H may be applied to a coil 131 to actuate a transfer switch arrangement of the type disclosed in FIG. 4. Coil 131 could also be utilized to actuate an indicating device, either in conjunction with the transfer switch of FIG. 4 or independently thereof. For example, coil 131 could be utilized to close fuse actuating switch 133 of FIG. 3. Closure of switch 133 would short the motor voltage to the common line, resulting in activation or blowing of the fuse 59. Blowing of fuse 59 would serve the dual function of providing an indication of trouble to an operator, while also disconnecting motor 53 to prevent its actuation of movable tap contacts 37 and 39. Of course, other types of indicating devices could also be utilized, such as a lamp or an audible signal.

One problem that might be encountered is that if the tapchanging transformer was utilized without a load (i.e., operating into a no-load condition), the lack of current flow through the non-arcing switch 45 would cause the fail-safe circuit 77 to produce an output signal. In order to preclude this type of operation, a current transformer 135 is located in load line 13. If current is flowing in load line 13, current transformer 135 will produce a signal to be applied to the rectifier formed by diodes 137, 139, 141 and 143. This signal will energize the relay coil 145 to close the normally open switch 147 in line 149 conveying voltage from the motor to terminal A. (Switch 147 could also be located at any other appropriate position in the circuit, such as in line 85.) However, if there is no load current, the normally open switch 147 will preclude the production of an input signal on line 85. Therefore, the absence of a triggering voltage at point 111 will not result in the production of an output signal across terminals G and H.

With respect to the preferred embodiment of the transfer switch illustrated in FIG. 4, it may be noted that a frame having two elements 151 and 153 is schematically illustrated. A current conducting contact block 155 is mounted on a contact block carrying member 157, which extends through the frame portions 151 and 153. Contact block 155 has a first portion 159 adapted to engage stationary contacts 161 and 163 and a second portion 165 adapated to engage stationary contacts 167 and 169. One end of contact block carrying member 157 has a latching portion 171 which is engaged by armature 173 actuated by coil 131.

Adjacent the other end of contact block carrying member 157 there is located a dashpot 175, which includes a cylinder 177 and a piston 179. Dashpot 175 is located internally of frame portion 151, while externally of this frame portion 151 there is located a compression spring 181 positioned between frame portion 151 and a stop 183 on the contact block carrying member 157.

The operation of the transfer switch of FIG. 4 may now be understood by reference to FIG. 4 in connection with FIGS. 5-7. In FIG. 4, the position of the transfer switch during normal operation is depicted. In such position, contact block 155 connects the source applied to terminal 185 to terminal 21 (FIG. 1). In addition to the simple conducting path through contacts 161 and 167 to terminal 21, there is a parallel path through contact 163 and an impedance, such as a resistor 187. The purpose of the impedance or resistor 187 is to limit the circulating current and the resulting arc that results upon actuation of the transfer switch.

Upon production of an output signal by fail-safe circuit 77, coil 131 is energized to withdraw armature 173 from engagement with latch portion 171. As a result, compression spring 181 forces the contact block carrying member 157 to the left (FIG. 4 orientation). As may be seen in FIG. 5, the first effect of this travel is to remove the portion 165 of contact block 155 from contact 167. However, portion 159 of contact block 155 is still in engagement with contact 163, so that current flow to the tap-changing transformer continues through resistor 187. At this point, portion 165 of contact block 155 has not yet been brought into engagement with contact 169.

Further motion of contact block 155 (as illustrated in FIG. 6), brings portion 165 of contact block 155 into engagement with contact 169. Portion 159 still engages contact 163, so that the circulating current is limited by resistor 187. Also at this point, piston 179 of dashpot 175 is beginning to compress the fluid in cylinder 177 to slow the motion of the contact block carrying member 157 produced by spring 181.

Finally, as seen in FIG. 7, portion 159 of contact block 155 is removed from contact 163, so that the source on terminal 185 is connected directly to a terminal 189, to which is connected to load line 13. Hence, the tap-changing transformer has been circumvented and the source connected directly to the load line. Dashpot 175 also serves to cushion the impact at this final position to prevent contact bounce and damage to switch elements. After correction of the problem, the transfer switch may be manually reset by urging contact block carrying member 157 against the force of spring 181 to permit the armature 173 to once again engage the latching portion 171.

The impedance or resistor 187 could also involve a network in which the current to the tap-changing transformer would be decreased is sequential steps. A resistive network for achieving this procedure is schematically illustrated in FIG. 8. Accordingly, a resistor 191 is connected to a stationary contact 193, a resistor 195 is connected to a stationary contact 197, a resistor 199 is connected to a stationary contact 201, and a resistor 203 is connected to a stationary contact 205. Purely for illustrative purposes, resistors 191 and 195 are 0.1 ohm, resistor 199 is 0.3 ohm and resistor 203 is 0.8 ohm. With such an arrangement, the initial movement of contact block 155 would cause it to leave contact 167 so that current flow would be through the 0.1 ohm of resistor 191. Further motion of contact block 155 would bring it into engagement with contact 197, so that current flow would be through the parallel path of resistors 191 and 195, with a resistance of 0.05 ohm. Continued motion of contact block 155 would remove it from contact 193, so that all current flow would be through the 0.1 ohm of resistor 195. At the point that contact block 155 was brought into engagement with both contacts 197 and 201, all current flow would still continue through resistor 195. As contact block 155 leaves contact 197, the resistance would increase to the 0.4 ohm of resistors 195 and 199. As in the case of contacts 197 and 201, engagement of contact block 155 with contacts 201 and 205 continues the current flow through the 0.4 ohm of resistors 195 and 199. As contact block 155 is disengaged from contact 201, the total resistance in the circuit from terminal 185 to terminal 21 increases to the 1.2 ohm of resistors 195, 199 and 203. And finally, the contact block is brought into engagement with contact 169 to connect the source on terminal 185 directly to the load line of terminal 189.

It should be understood that various modifications, changes and variations may be made in the arrangements, operations and details of construction of the elements disclosed herein without departing from the spirit and scope of this invention.

We claim:

1. In a tap-changing transformer regulating system connecting a source of energy to a load and having a pair of movable tap contacts, a plurality of stationary contacts, a non-arcing switch to momentarily carry current while the line to one of the movable tap contacts that is to be transferred from one stationary contact to another is opened, the non-arcing switch then being opened to terminate current flow to the movable tap contact to permit its transfer without arcing, and an electrically energizable device to actuate the movable tap contact, the improvement of a fail-safe circuit responsive to undesired current conditions in the non-arcing switch to protect the transformer system and comprising:

monitoring means to detect current flow through the non-arcing switch and provide a reference signal indicative thereof;

input means to provide an input signal corresponding to the energizing voltage applied to the energizable device;

a fail-safe control switch closed upon opening of the non-arcing switch preparatory to a tap change;

output means; and control means responsive to said reference signal and said input signal and operative upon closure of said fail-safe control switch to cause said output means to produce an output signal if current were not flowing through the non-arcing switch immediately prior to opening thereof and to produce an output signal if current continues to flow through the non-arcing switch for longer than a predetermined time after opening thereof.

2. A fail-safe circuit as claimed in claim 1 wherein said control means comprises:

bypass means to prevent said input signal from being conveyed to said output means if current was flowing through the non-arcing switch immediately prior to opening thereof; and timing means to prevent said reference signal from being conveyed to said output means if current flow through the non-arcing switch is discontinued within a predetermined time after opening thereof.

3. a fail-safe circuit as claimed in claim 2 wherein:

said bypass means comprises a first SCR having said input signal connected thereacross and said reference signal connected to the gate electrode thereof, said reference signal triggering said first SCR into conduction so that said input signal does not produce a voltage drop across said first SCR; and said output comprises a second SCR, the gate electrode of said second SCR connected to have the voltage drop across said first SCR and said reference signal applied thereto.

4. A fail-safe circuit as claimed in claim 3 and further comprising a transfer switch arrangement to which said output signal is applied to cause the source to be connected directly to the load upon operation of the fail-safe circuit.

5. A fail-safe circuit as claimed in claim 4 wherein:

said monitoring means comprises a current transformer to detect current flow through the non-arcing switch and a rectifier circuit to produce a DC reference signal; and said input means comprises a rectifier circuit to provide a DC input signal.

6. In a tap-changing transformer regulating system connecting a source of energy to a load and having a pair of movable tap contacts, a plurality of stationary contacts, a non-arcing switch to momentarily carry current while the line to one of the movable tap contacts that is to be transferred from one stationary contact to another is opened, the non-arcing switch then being opened to terminate current flow to the movable tap contact to permit its transfer without arcing, and an electrically energizable device to actuate the movable contact, the improvement of a fail-safe circuit responsive to undesired current conditions in the non-arcing switch to protect the transformer system and comprising:

a first gating means;

input means to connect an input signal corresponding to the energizing voltage applied to the energizable device across said first gating means when the energizable device is energized;

monitoring means to detect current flow through the non-arcing switch and provide a reference signal indicative thereof, said reference signal triggering said first gating means to a conducting state when said monitoring means detects current flow through the non-arcing switch;

second gating means;

a fail-safe control switch that is open when the non-arcing switch is closed and closed when the non-arcing switch is open, closure of fail-safe control switch causing said second gating means to be triggered by said input signal if said first gating means were not triggered by said reference signal, indicating a lack of current flow through the non-arcing switch when it was closed, and causing said second gating means to be triggered by said reference signal if said monitoring means continues to detect current flow through the non-arcing switch longer than a predetermined time after the non-arcing switch is opened;

fail-safe responsive means actuated by triggering of said second gating means; and load current responsive means to disable the fail-safe circuit in the absence of a load current.

7. A fail-safe circuit as claimed in claim 6 wherein said fail-safe responsive means comprises a transfer switch means to connect the source directly to the load to circumvent the tap-changing transformer system when said second gating device is triggered as a result of an erroneous current flow condition through the non-arcing switch.

8. A fail-safe circuit as claimed in claim 6 wherein:
said first gating means comprises a first SCR having said input signal connected thereacross and said reference signal applied to the gate electrode thereof; and
said second gating means comprises a second SCR having one side of said fail-safe control switch connected to the gate electrode thereof.

9. A fail-safe circuit as claimed in claim 8 wherein:
said input means comprises a rectifying circuit to produce a DC input signal;
said monitoring means comprises a current transformer to detect current flow through the non-arcing switch and a rectifying circuit to provide a DC reference signal; and
said predetermined time is established by a timing circuit connected to the gate electrode of said second SCR.

10. A fail-safe circuit as claimed in claim 6 wherein said load current responsive means comprises:
a current transformer to detect current flow to the load from the tap-changing transformer and provide a signal indicative thereof; and
switch means responsive to the absence of a signal from said current transformer to disconnect the energizing voltage for the energizable device from the fail-safe circuit.

11. In a tap-changing transformer regulating system connecting a source of energy to a load and having a pair of movable tap contacts, a plurality of stationary contacts, a non-arcing switch to momentarily carry current while the line to one of the movable tap contacts that is to be transferred from one stationary contact to another is opened, the non-arcing switch then being opened to terminate current flow to the movable tap contact to permit its transfer without arcing, and an electrically energizable device to actuate the movable tap contact, the improvement of a fail-safe circuit responsive to undesired current conditions in the non-arcing switch to protect the transformer system comprising:

a first rectifier circuit, the voltage applied to the electrically energizable device also being connected across said first rectifier circuit, said first rectifier providing a DC input voltage;

a first gating device having a gate terminal, said input voltage being connected across said first gating device;

a first current transformer to detect current flow through the non-arcing switch;

a second rectifier circuit, the voltage from said first current transformer being applied to said second rectifier circuit, said second rectifier circuit providing a DC triggering voltage, said triggering voltage being conveyed to the gate terminal of said first gating device to activate said first gating device to provide a conducting path so that no voltage is developed thereacross;

a fail-safe control switch that is open when the non-arcing switch is closed and closed when the non-arcing switch is open, said triggering voltage and the voltage across said first gating device being connected to a first side of said fail-safe switch;

a unidirectional conducting device located in the line conveying said triggering voltage to said fail-safe control switch to prevent the voltage across said first gating device from actuating said gating device to provide a conducting path for said input voltage;

a second gating device having a gate terminal, the other side of said fail-safe control switch connected to the gate terminal of said second gating device to provide an actuating voltage for said second gating device;

a timing circuit connected to the gate terminal of said second gating device to delay actuation of said second gating device a predetermined time after application of a signal to the gate terminal thereof, said predetermined time being sufficiently long to preclude actuation of said second gating device if the current flow through the non-arcing switch discontinues upon opening of the non-arcing switch;

a second current transformer to detect current flow to the load supplied from the tap-changing transformer and provide a signal indicative thereof;

disabling means responsive to the signal from said second current transformer to render the fail-safe circuit inoperative if there is no load current; and transfer switch means to connect the source directly to the load to circumvent the tap-changing transformer system when said second gating device is actuated as a result of an erroneous current flow condition through the non-arcing switch.

12. A fail-safe circuit as claimed in claim 11 wherein:

said first and second gating devices are silicon controlled rectifiers;
said unidirectional conducting device is a diode;
said timing circuit comprises an RC network and a breakdown device;
said disabling means comprises a switch to open the line to said first rectifier circuit; and
said transfer switch means comprises a movable contact block, a plurality of stationary contacts, a contact block carrying member held in a rest position against the force of a compression spring, release of said contact block moving to connect the source of energy directly to the load, and an impedance path through which the contact block connects the energy source to the transformer tap contacts prior to connecting the energy source directly to the load.

* * * * *